United States Patent [19]
Lee

[11] Patent Number: 5,396,242
[45] Date of Patent: Mar. 7, 1995

[54] SUPERCONDUCTIVITY BINARY ODOMETER

[76] Inventor: Gregory S. Lee, 357 Anna Ave., Mt. View, Calif. 94043

[21] Appl. No.: 88,697

[22] Filed: Jul. 8, 1993

Related U.S. Application Data

[63] Continuation-in-part of Ser. No. 936,196, Aug. 26, 1992.

[51] Int. Cl.$^6$ ............................................. H03M 1/12
[52] U.S. Cl. ........................................................ 341/133
[58] Field of Search ........................ 341/133, 155, 156; 505/864, 827

[56] References Cited

U.S. PATENT DOCUMENTS

| | | | |
|---|---|---|---|
| 4,646,060 | 2/1987 | Phillips et al. | 341/133 |
| 4,983,971 | 1/1991 | Przybysz et al. | 341/133 |
| 5,012,243 | 4/1991 | Lee | 341/133 |

OTHER PUBLICATIONS

"Josephson Junction A/D Converters Using Differential Coding", by Rylov et al. IEEE Transactions on Magnetics, vol. MAG-23, No. 2, pp. 735–738 Mar. 1987.
"Basic Operations Of the Quantum Flux Parametron", by Harada et al., IEEE Transactions on Magnetics, vol. M, No. 5, pp. 3801–3807 Sep. 1987.
"Sensitivity of the Balanced Josephson–Junction Comparator", by Filippov et al., vol. 27, No. 2, pp. 2452–2455 Mar. 1991.
John P. Hurrell et al., Analog-to-Digital Conversion with Unlatched Squid's Oct. 1980, pp. 1887–1896.

Primary Examiner—Brian K. Young

[57] ABSTRACT

A superconducting bidirectional counter. The device finds application in very fast and very high precision analog-to-digital (A/D) converters. The counter does not need to consume any bias power.

20 Claims, 6 Drawing Sheets

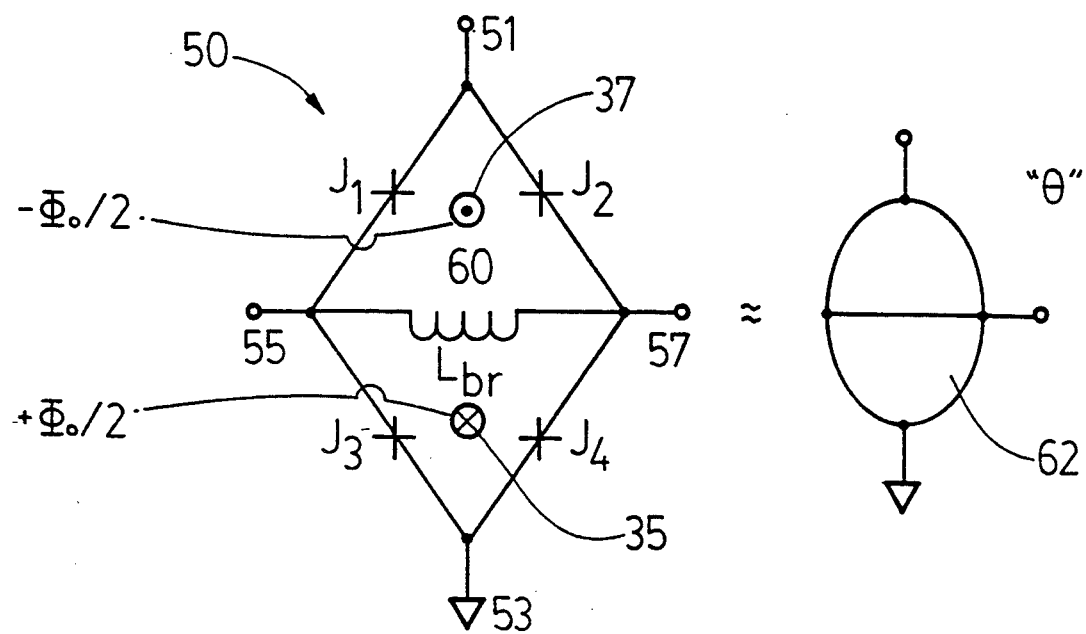
FIG._1A.
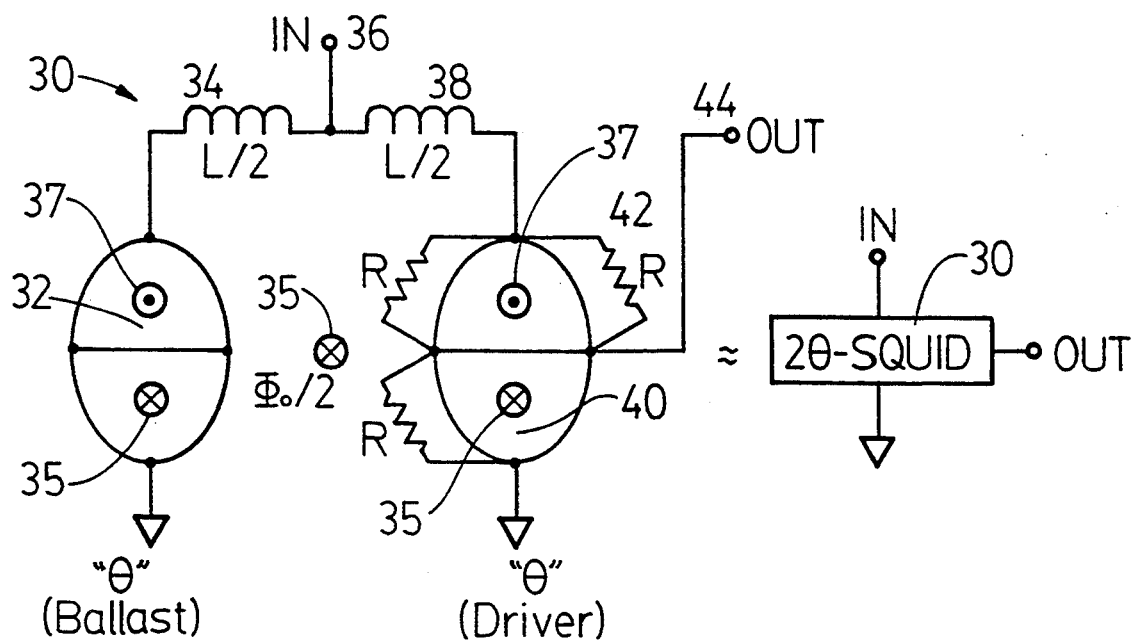
FIG._1B

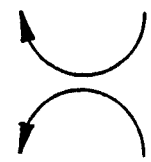
"0" state
FIG._1C.
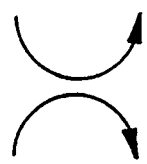
"I" state
FIG._1D.
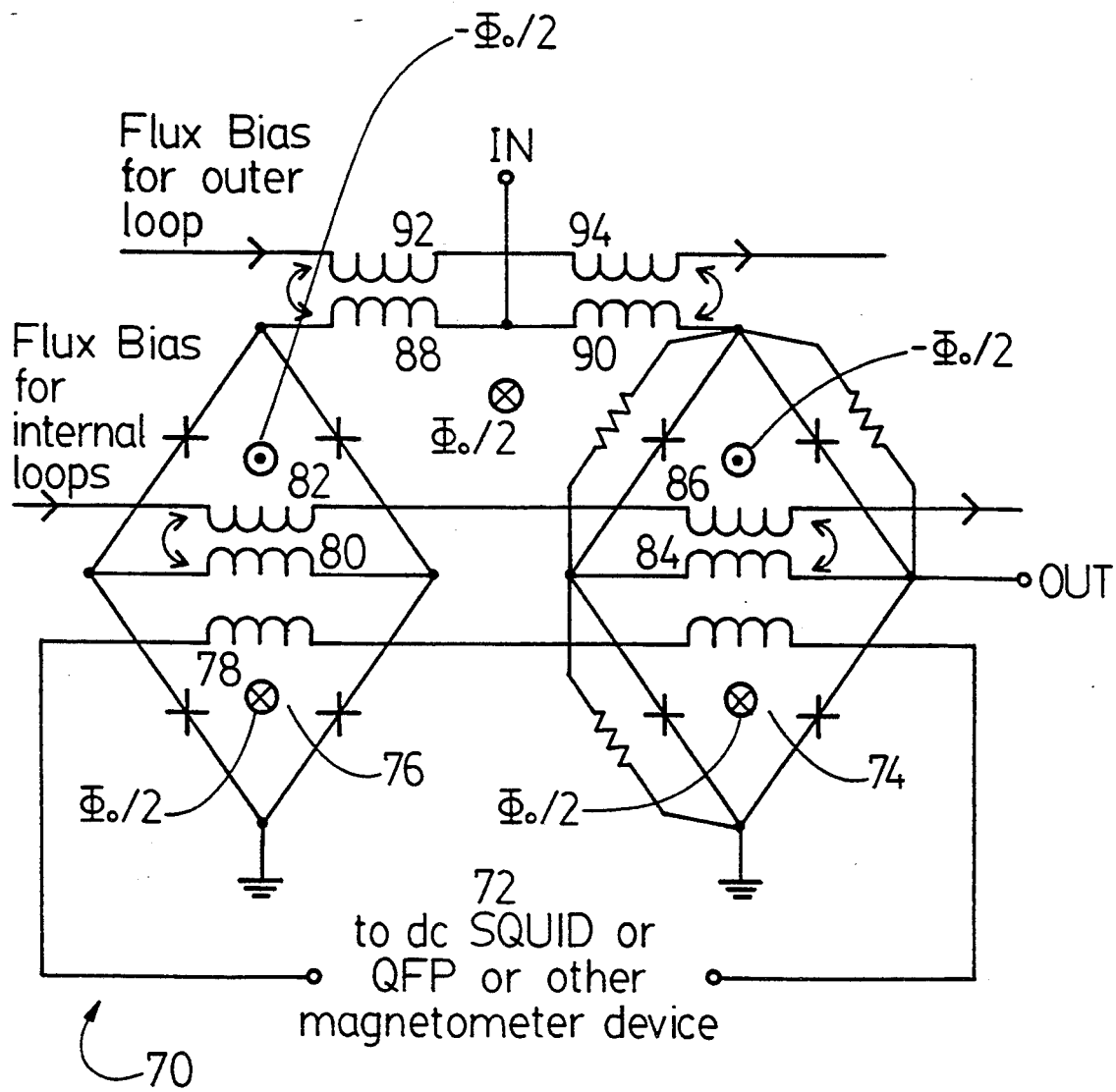
FIG._2.

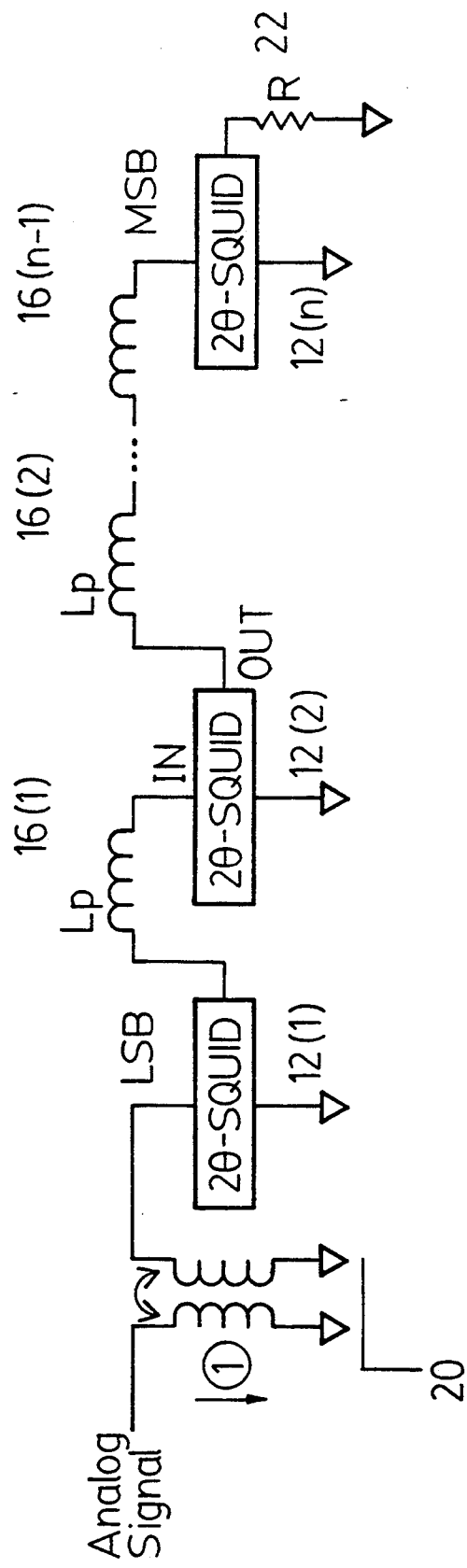
FIG._3.
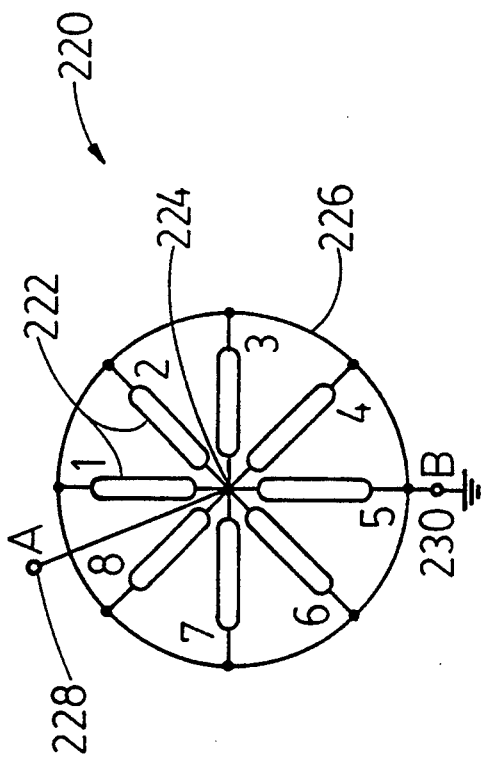
FIG._5A.

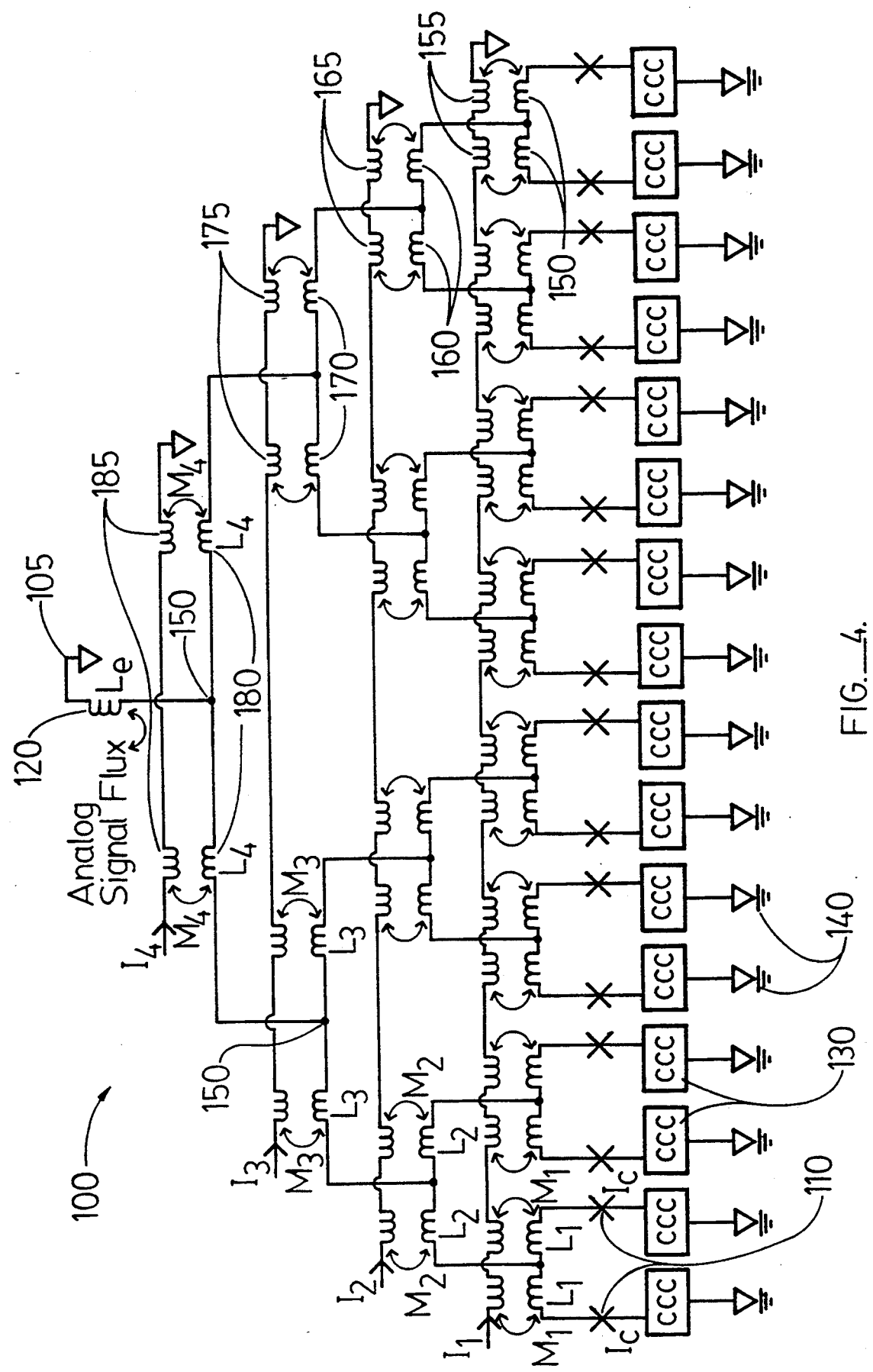
FIG._4.

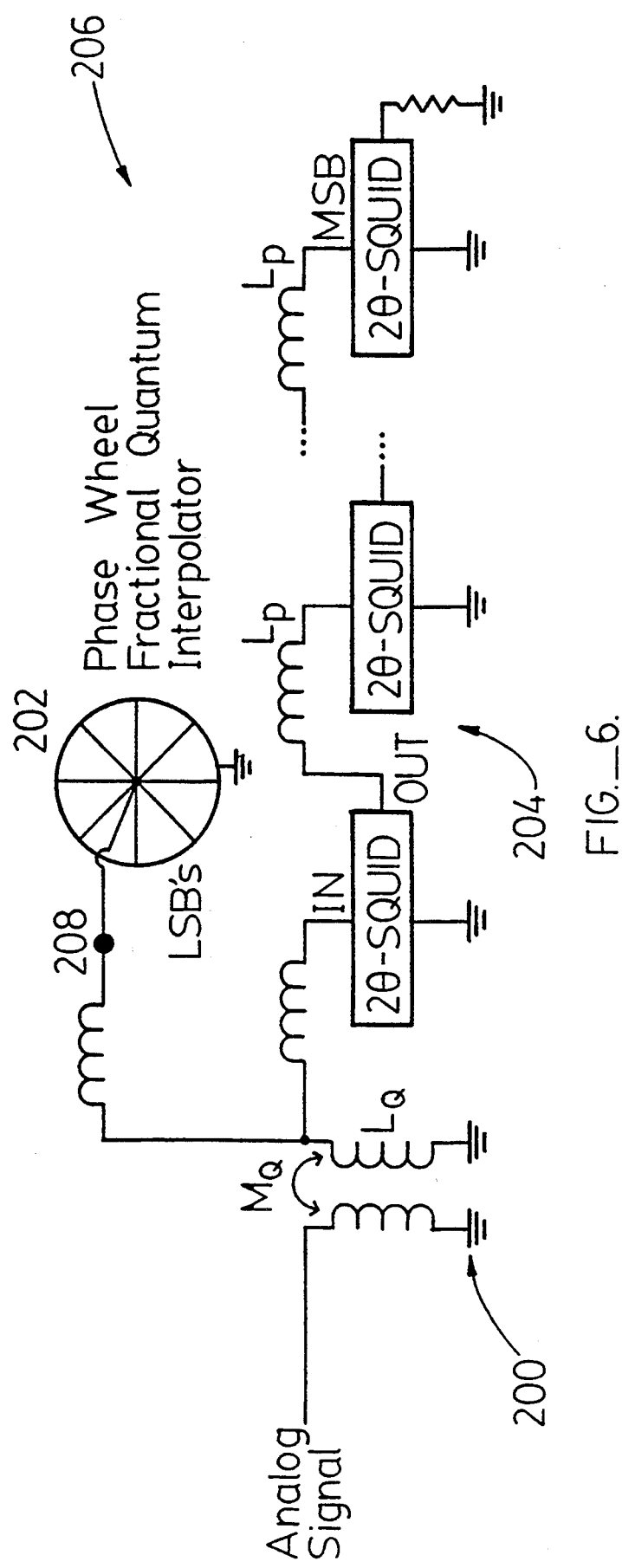
FIG._6.

SUPERCONDUCTIVITY BINARY ODOMETER

CROSS REFERENCE TO RELATED APPLICATION

This is a continuation-in-part application of parent application Ser. No. 07/936,196, filed Aug. 26, 1992, entitled "Superconducting Quantizer and A/D Converter System."

BACKGROUND OF THE INVENTION

The present invention relates generally to compound flip-flops, superconducting bidirectional counters, and analog-to-digital converters. More particularly, the present invention relates to high-speed, high-resolution truly bidirectional analog-to-digital converters employing superconducting Josephson junctions.

High-performance analog-to-digital converters are required in a variety of electronic devices. Two of the most important measures of an A/D converter's performance are the number of samples converted per second or speed of conversion and resolution measured by the smallest increment in change that can be detected in the analog signal. A/D conversion with a resolution greater than 8 bits and an effective aperture on the order of a picosecond has not been achieved so far. In conventional state of the art semiconductor electronics, flash converters can achieve about 7 effective bits at a few picosecond apertures. In available conventional A/D converters the trend is that the greater the number of bits N (resolution), the poorer the speed of conversion, and the maximum bandwidth falls off faster than $2^{-N}$.

Superconducting technology which employs Josephson junctions as its basic switching elements is well-suited to perform high-speed, high-resolution A/D conversion because of the unique characteristics of Josephson junctions. A Josephson junction is a bistable switching device having a very thin insulating layer between two superconducting electrodes. The Josephson junction has two states: a superconducting zero-voltage state and a resistive voltage state, in which the voltage drop across the device is equal to the energy gap of the superconducting material. When current applied to the junction is increased above the critical current of the junction, the device is switched from the superconducting state to the voltage state. This switching operation can occur in a few picoseconds; therefore the Josephson junction is a high speed switching device.

However, high speed switching (few picoseconds) in underdamped Josephson junctions (those with high shunt resistance) can be achieved only from the superconducting state to the voltage state. The reset switching from the voltage state to the superconducting state cannot be achieved by merely lowering the signal current, the circuit remains in its voltage state. This property is called latching.

To achieve non-latching fast switching from the voltage state to the superconducting state the Josephson junction has to be overdamped, i.e. should include relatively low shunt resistance. In this approach the binary information is not presented by the dc voltage, as in the case of semiconductor transistor logic, as well as in the case of superconducting latching logic. The binary information is presented by very small flux quantum pulses, which can be quite naturally generated, reproduced, amplified, memorized and processed by elementary circuits comprising overdamped Josephson junctions.

One or more of the overdamped Josephson junctions combined with one or more inductors form a logic circuit called a SQUID (Superconductive Quantum Interference Device.) The single SQUID includes an overdamped Josephson junction connected across an inductor to form a superconducting loop. Therefore, a counter employing SQUIDs is a non-latching counter. The magnetic flux in the loop increases by a small quantum when the current applied to the SQUID increases by a small and precisely repeatable increment. This quantum of flux generates a small pulse of voltage across the junction. When the current applied to the junction decreases by a like increment, the magnetic flux in the superconducting loop decreases by the small quantum of flux producing a negative voltage pulse across the junction. This explains why Josephson junction logic provides high resolution in A/D conversion. In this manner the SQUID functions as a quantizer, with the pulses being detected and counted by binary counters.

Superconducting non-latching A/D converters have almost perfect linearity because a single flux quantum is only $2.07 * 10^{-15}$ weber and the current increment or decrement is the flux quantum divided by the value of the inductor in henries.

Superconducting non-latching unidirectional counters have been proposed and partially demonstrated. See J. P. Hurrell, D. C. Pridmore-Brown, and A. H. Silver, *IEEE Trans. Electron Devices*, ED-27, 1887 (1980); V. K. Kaplunenko, M. I. Khabirov, V. P. Koshelets, K. K. Likharev, O. A. Mukhanov, V. K. Semenov, I. L. Serpuchenko, and A. N. Vystavkin, *IEEE Trans. Magn.*, 25, 861 (1989); C. A. Hamilton and F. L. Lloyd, *IEEE Electron Device Lett.*, EDL-3, 335 (1982); A. H. Silver, R. R. Phillips, and R. D. Sandell, *IEEE Trans. Magn.*, MAG-21, 204 (1985).

In prior art unidirectional counters the relative timing of multiple signals arriving at the asynchronous logic gates was extremely critical. The analog signal is inherently fully asynchronous with respect to the A/D conversion. As a result, none of the prior art unidirectional counters were capable of counting analog signals with greater than 100 GHz repetition rates.

Several bidirectional superconducting counters also have been proposed. See R. R. Phillips, A. H. Silver, and R. D. Sandell, U.S. Pat. No. 4,646,060 (February 1987); K. K. Likharev and V. K. Semenov, *IEEE Trans. on Appl. Superconductivity*, 1,3 (1991); G. S. Lee, U.S. Pat. No. 5,012,243 (April 1991).

The prior art bidirectional counters were basically unidirectional counters with some extra asynchronous logic added to distinguish the down-counting from the up-counting. Therefore, the bidirectional counters had the same timing problem as the unidirectional counters.

Therefore, it is desirable to provide an improved fast and high precision analog-to-digital bidirectional converter.

SUMMARY OF THE INVENTION

The present invention is unique because it enables the practical realization of a fast and high precision bidirectional A/D superconductive converter using a novel compound flip-flop.

One aspect of the present invention is directed to a superconducting apparatus, responsive to an input analog signal. The apparatus includes a superconducting quantum interference compound flip-flop which comprises at least two internal flip-flops and a biasing device coupled to the compound flip-flop for biasing said two internal flip-flops so that they have different phases.

In the preferred embodiment, a readout device is magnetically connected to one or both of the internal flip-flops, and the compound flip-flop includes two inductors each connecting one of the two internal flip-flops to a common node forming a superconducting outer loop. Each internal flip-flop includes four substantially identical Josephson junctions J1, J2, J3, J4 connected to form a ring, a bridge inductor and damping resistors. Josephson junctions J1 and J3 are connected to a first node. Josephson junctions J2 and J4 are connected to a second node. Josephson junctions J1 and J2 are connected to a third node. Josephson junctions J3 and J4 are connected to a fourth node. The bridge inductor is connected between the first and the second nodes; the fourth node is connected to a reference voltage (preferably a superconducting ground). When the input signal is applied to the third node the readout device detects a readout signal from the bridge inductor.

In the preferred embodiment, the ring contains two internal superconducting loops. One internal loop is a lower loop defined by Josephson junctions J3, J4 and the bridge inductor. The other internal loop is an upper loop defined by Josephson junctions J1, J2, and the bridge inductor. Each of the Josephson junctions is connected in parallel with a damping resistor. The biasing device may simply be control lines magnetically coupled to the apparatus to apply half of a flux quantum $\Phi_0/2 = 1.034 * 10^{-15}$ Webers to the outer superconducting loop as well as to the two internal superconducting loops of each of the internal flip-flops of the compound flip-flop. The readout device may simply be a magnetometer device coupled to one or both of the bridge inductors of the internal flip-flops. If both bridge inductors are so coupled the signals of the bridge inductors are added in quadrature in the magnetometer.

Another aspect of the present invention is directed to a superconducting circuit for counting or for the analog-to-digital conversion of an input analog signal to a digital signal. The circuit has a plurality of bidirectionally counting compound flip-flops connected to each other in a sequence.

In the preferred embodiment, when an input analog signal is applied to the first of the compound flip-flops in the sequence, the first compound flip-flop counts the least significant bit of the input signal, and each compound flip-flop downstream from the first compound flip-flop in the sequence counts the next more significant bit than the preceding compound flip-flop. The input node of each compound flip-flop downstream from the first is connected through an inductor $L_p$ to the second node of the second driver-flip-flop of the preceding compound flip-flop in the sequence. When the input signal is applied to the input node of the first compound flip-flop the readout device detects a readout signal from the bridge inductor of each internal flip-flop of the compound flip-flop.

Yet one additional aspect of this invention is directed to the combination of the superconducting bidirectional flux quantum counter and the phase wheel/tree interpolator connected to the counter in parallel. The counter comprises a plurality of bidirectional compound flip-flops connected to each other in sequence. The input analog signal is applied to the first compound flip-flop in the sequence. The bidirectional counter counts the analog signal to the nearest flux quantum. The phase wheel/tree interpolates the analog signal to $\frac{1}{2}^{p+1}$ of a flux quantum modulo the flux quantum.

BRIEF DESCRIPTION OF THE DRAWINGS

FIG. 1A is a schematic circuit diagram of a flip-flop employing Josephson junctions to illustrate the invention.

FIG. 1B is a schematic circuit diagram of a compound flip-flop including two flip-flops of the type shown in FIG. 1A.

FIG. 1C illustrates the "0" state of the internal flip-flop of FIG. 1A.

FIG. 1D illustrates the "1" state of the internal flip-flop of FIG. 1A.

FIG. 2 is a schematic circuit diagram of a compound flip-flop and a readout device coupled to the compound flip-flop.

FIG. 3 is a schematic circuit diagram of a binary bidirectional counter and analog-to-digital converter using a sequence of compound flip-flops to illustrate an embodiment of this invention.

FIG. 4 is a schematic circuit diagram of a phase tree type interpolator circuit.

FIG. 5A is a schematic circuit diagram of a phase wheel type interpolator circuit.

FIG. 6 is a schematic circuit diagram illustrating the combination of the bidirectional flux quantum counter of FIG. 3 with the phase wheel fractional flux quantum interpolator of FIG. 5A.

Identical components in the figures are labeled by the same numerals.

DESCRIPTION OF THE PREFERRED EMBODIMENT

Figure 5B:
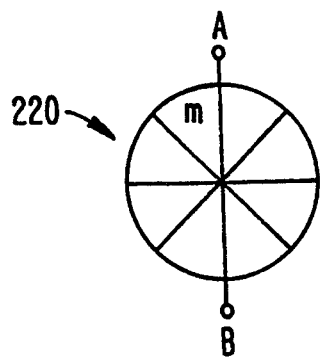
FIG. 5B is a short hand symbol of the circuit of FIG. 5A.

FIG. 1A illustrates the construction of a flip-flop 50, comprising two internal superconductive loops. The first internal superconductive loop includes the substantially identical Josephson junctions J1, J2 and a bridge inductor 60. The second internal superconductive loop includes the substantially identical Josephson junctions J3, J4 and the same bridge inductor 60. The type of structure in flip-flop 50, referred to below as a Θ-SQUID (SQUID stands for Superconductive Quantum Interference Device), is known in the art. See V. K. Kaplunenko, M. I. Khabirov, V. P. Koshelets, K. K. Likharev, O. A. Mukhanov, V. K. Semenov, I. L. Serpuchenko, and A. N. Vystavkin, *IEEE Trans. Magn.*, 25, 861 (1989).

FIG. 1B depicts the construction of a compound flip-flop 30, which may also symbolically be called a 2Θ-SQUID 30. The 2Θ-SQUID is the subject of this invention. This is a superconducting truly bidirectional counting device which does not consume any bias power. Junctions J1 and J3 are connected at node 55. Junctions J1 and J2 are connected at node 51. Junctions J2 and J4 are connected at node 57. Junctions J4 and J3 are connected at node 53. Junctions J1–J4 are connected to form a ring.

Each compound flip-flop 30 includes a pair of internal flip-flops 32 and 40, or Θ-SQUIDs, referred to below simply as "Θ's". Each of the internal flip-flops has four damping resistors 42 (some resistors are omitted for clarity of the figure). Both internal flip-flops are connected through inductors 34 and 38 to an input node 36 forming an outer superconducting loop. The first internal flip-flop 32 is called "Ballast", the second internal flip-flop 40 is called "Driver". The meaning of those words becomes clear below. A compound flip-flop may actually include more than two flip-flops of the type similar to flip-flops 32, 40; however, in such event, the extra flip-flops serve the same function as the ballast flip-flop 32. All such variations are within the scope of the invention.

Magnetic flux biasing may be applied to the two internal flip-flops as well as the outer superconducting loop using a biasing device such as magnetically coupled control lines 92, 94, 82, 86 in FIG. 2. Half of a flux quantum $(\Phi_0/2) = 1.034 * 10^{-15}$. Webers is applied to each of the two loops (formed by J1, J2, 60; and by J3, J4, 60) in each of the two internal flip-flops in the 2Θ-SQUID, and to the outer loop between the Θ's. The directions of these flux biases are indicated by the encircled crosses 35 (direction of flux going into the plane of the diagram) and dots 37 (direction of flux going out of the plane of the diagram) in FIGS. 1A, 1B. In principle, these flux biases need not consume any power. In practice, one can usually afford some dissipation in bias resistors.

As shown by the crosses 35 and dots 37 in FIG. 1B, flip-flop 32 is preferably biased to a state which is 180 degrees out of phase with the state of flip-flop 40 by a biasing device (not shown in FIG. 1B). It will be understood that it is adequate for the two flip-flops to be out of phase by other than 180 degrees; all such variations are within the scope of the invention. As long as the two flip-flops are out of phase, the applications below using compound flip-flops, such as in counters and A/D converters, will function as described.

The flux biases internal to the Θ's render the Θ's to be bistable flip-flops. When the flux bias is near a half flux quantum, the junctions that appear as diagonally opposite pairs (a first pair J1-J4 and a second pair J2-J3) are essentially phase-locked to each other. The diagonal pair (J1-J4) is 180 degrees out of phase with the other diagonal pair (J2-J3).

A "0" state shown in FIG. 1C is defined by counterclockwise circulation current (CCW) in the lower internal loop and to clockwise circulation current (CW) in the upper internal loop. A "1" state shown in FIG. 1D is defined by counterclockwise circulation current (CCW) in the upper internal loop and a clockwise circulation current (CW) in the lower internal loop.

Readout of the compound flip-flop can be accomplished by sensing the current in the bridge inductors. The device 70 is shown in FIG. 2, where the readout device 72 (dc SQUID, Quantum Flux Parametron (QFP), etc) magnetically senses the sum of the bridge currents of the bridge inductors 80 and 84 of the first internal flip-flop 76 and the second internal flip-flop 74. In the "0" state the bridge inductor currents flow to the left, whereas in the "1" state the bridge inductor currents flow to the right. This is a relatively large signal and is readily discriminated by a SQUID or a QFP read device 72. However, the bridge currents from the two flip-flops are added in quadrature because of the $\Phi_0/2$ flux bias to the outer loop of the compound flip-flop. That is, the binary state of the first internal flip-flop may be shifted from the binary state of the second internal flip-flop because they are generally 180 degrees out of phase. But, by reading the sum of the bridge currents one still can obtain a well-defined binary state for the 2Θ-SQUID compound flip-flop which in fact has the properties of minimal hysteresis and maximal line-up of all bits.

FIG. 3 illustrates a superconductive binary bidirectional counter and analog-to-digital converter 20 which comprises a plurality of 2Θ-SQUID compound flip-flops connected in sequence. An analog signal 10 is introduced to the first of the sequence of unpowered compound flip-flops 12(1), 12(2), . . . 12(n), n being a positive integer, coupled to each other through the inductors 16(1), 16(2) . . . 16(n−1). The first compound flip-flop 12(1) counts the least significant bit (LSB), and the last compound flip-flop 12(n) counts the most significant bit (MSB). The second compound flip-flop 12(2) is a subsequent stage to the first compound flip-flop 12(1), the third compound flip-flop 12(3) is a subsequent stage to the second compound flip-flop 12(2) and so on. Each compound flip-flop includes two internal flip-flops: a right-hand or driver flip-flop having a node that is the output of the compound flip-flop, and a left hand or ballast flip-flop.

The input node 36 of the compound flip-flop 12(k) downstream from the first compound flip-flop 12(1), k ranging from 2 to n, is connected through an inductor 16(k−1) of (n−1) inductors to the node or output 44 (see FIG. 1B) of the right-hand driver flip-flop of the preceding compound flip-flop 12(k−1) in the sequence. When the input signal is applied to the input node of the first compound flip-flop 12(1), the readout device detects a readout signal from the bridge inductor of one or both internal flip-flops of the compound flip-flop 12(1).

The first internal flip-flop 32 depicted in FIG. 1B is called "Ballast" and the second internal flip-flop 40 in FIG. 1B is called "Driver". When the input analog signal is applied to the compound flip-flop 30 through the node 36, the "Driver" flip-flop sends forth drive current through the node 44, while the "Ballast" acts to counterbalance the driver flip-flop to minimize the required drive current of the compound flip-flop.

The 2Θ-SQUID compound flip-flop can count up and down. An up-count may occur in two different ways.

First, if the right-hand or driver flip-flop is in the initial "0" state, a positive current increment at the input will cause J2 and J3 to momentarily switch in a positive sense reversing the circulating currents so that a CW circulation remains in the lower loop and a CCW circulation remains in the upper loop. This corresponds to the up-count switching from the initial state "0" to the state "1". Such up-count switching does not provide a signal to the subsequent stage.

Secondly, in the initial "1" state, a positive current increment at the input causes J1 and J4 to momentarily switch in a positive sense reversing the circulation currents so that CCW circulation remains in the lower loop and the CW circulation remains in the upper loop. This corresponds to the up-count switching from the initial state "1" to the state "0". The momentary positive switching of J4 causes the propagation of a "CARRY" signal from the drive device which adds current to the subsequent compound flip-flop in the sequence.

A down count may also occur in two different ways.

Firstly, a negative current increment at the input with the initial state "0" will cause J1 and J4 to momentarily switch in a negative sense reversing the circulation currents so that CCW circulation remains in the upper loop and the CW circulation remains in the lower loop, which corresponds to the down-count switching from the initial state "0" to the state "1". The momentary negative switching of J4 causes the propagation of the "BORROW" signal from the driver device which subtracts current from the subsequent stage.

Secondly, in the initial state "1" a negative current increment causes J2 and J3 to momentarily switch in a negative sense reversing the circulation currents so that CCW circulation remains in the lower loop and the CW circulation remains in the upper loop, which corresponds to the down-count switching from the initial state "1" to the state "0". Such down-count switching does not provide a signal to the subsequent stage.

A flux bias to the outer superconductive loop of the 2Θ-SQUID substantially decreases the bias current. Indeed, the left-hand and right-hand Θ's of each 2Θ-SQUID contain redundant information. The right-hand Θ acts as the driver device to send forth CARRY or BORROW signals to subsequent stages. Therefore, the "0" and "1" states of the 2Θ-SQUID are determined by the "0" and "1" states of its right-hand Θ-SQUID. The left-hand Θ acts as a "ballast" to balance the action of the right-hand Θ. The balancing or ballast action works as follows. If each compound flip-flop has only a single Θ, the effective critical current to drive each stage would be too large and the compound flip-flop would require gate bias current to operate more than a single stage. This bias current would render the compound flip-flop unidirectional.

The superconducting quantum interference between the Θ's in each compound flip-flop substantially reduces the effective critical current. Thus, when the outer loop of the 2Θ-SQUID contains $\Phi_0/2$, its effective critical current is minimized. This minimizes the loading effect on the previous stage and therefore theoretically an infinite number of stages can be cascaded without use of gate bias. The only driving power comes from the input analog signal. The mechanical analogy to the superconducting interference between the Θ's is that one of the Θ's acts like a pendulum and the other Θ acts like a ballast pendulum 180 degrees opposite to the first one. In concert, the two pendula act like a gear.

The actual counting occurs when the CARRY signal caused by the positive increment of the analog signal propagates through the cascade and meets the first 2Θ-SQUID which has the initial state "0". The CARRY signal causes the transition of the state "0" of the 2Θ-SQUID into the state "1". In the process a flux quantum is consumed.

Similarly, the BORROW signal caused by the negative increment of the analog signal propagates through the cascade and meets the first 2Θ-SQUID which has the initial state "1". The BORROW signal causes the transition of the state "1" of that 2Θ-SQUID into the state "0". In the process a flux quantum is generated.

The proposed bidirectional compound flip-flop has several advantages over the existing technology. Firstly, the proposed compound flip-flop provides true bidirectional high speed counting and can operate without bias power. Secondly, the proposed device is compatible with the low-hysteresis single-junction type (rf SQUID) quantizers for A/D conversion. Indeed, the two-junction (dc SQUID) quantizers are known to have both static and dynamic hysteresis unless they are biased above threshold. If one has only unidirectional counters, one must use one for up-counting and one for down-counting in conjunction with the two-junction type quantizer. The necessity to bias the device above threshold means that both counters are forced to count much faster than they ordinarily would, leading to high error probability and severe aperture problems. On the other hand, single-junction (rf SQUID) quantizers can be designed with nearly zero hysteresis. The only previously proposed bidirectional counter that is compatible with a single-junction quantizer is the SQUAD counter disclosed in U.S. Pat. No. 5,011,143 (April 1991) by G. S. Lee. But, the SQUAD counter suffers from very small bias margins.

In many circumstances, the user may want much greater flux sensitivity than a flux quantum $\Phi_0$ as well as a large dynamic range (many $\Phi_0$'s). If this is the case, the only practical solution is to combine a counting A/D architecture with a periodic interpolation scheme. The interpolation provides the greater sensitivity and the periodicity of the interpolator guarantees that the extra sensitivity is retained throughout the large dynamic range covered by the counter. Such interpolator circuits are described in the pending U.S. patent application entitled "Superconducting Quantizer and A/D Converter System" by Gregory Lee and Herbert Ko., Ser. No. 07/936,196, filed Aug. 26, 1992. This application is incorporated herein by reference. The following description of the phase tree and phase wheel in reference to FIGS. 4, 5A–5D are taken from the above application. These interpolator circuits (Phase Wheel and Phase Tree) are generalizations of the rf SQUID quantizer. The proposed bidirectional counter uses single-ended input/output and is perfectly compatible with grounded rf SQUID quantizers. Therefore, it is also perfectly compatible with the Phase Wheel and the Phase Tree interpolators. The Phase Wheel/Tree allows one to go beyond regular superconducting A/D converter by introducing the phase wheel quantizer and the phase tree quantizer. Indeed, the regular superconductor A/D converters resolve the analog signal up to a single flux quantum $\Phi_0$. Both the phase tree and the phase wheel quantizers in combination with superconducting comparators are able to resolve $\frac{1}{2}^{p+1}$ of the magnetic flux quantum $\Phi_0$, where p is the number of branch conductor levels for the phase tree and $M=2^p$ is the number of spokes for the phase wheel.

One realization of the signal quantizer is the phase tree. The phase tree responds periodically to flux penetrating the loop with a period $\Phi_0$. Like the phase wheel or SQUID wheel, the phase tree has internal flux (phase) biasing which distinguishes the Josephson junctions and provides much more additional information than a single-junction SQUID.

A binary phase tree 100 has $2^p$ Josephson junctions 110, p being a positive integer, with p=4 as an example in FIG. 4. The junctions form the "leaves" of the tree. A shunt inductance 120 is connected to the "trunk" 105 of the tree, which is where the signal enters. The junctions are connected in series with clock current comparators (CCC's) 130 to the superconducting ground 140. Beginning at the trunk, at each branching point 150, the circuit splits into two identical superconducting branches. Connection inductances 152 at the leaf level are denoted $L_1$; connection inductances 160 at the next lowest level are denoted $L_2$, and so on (170 is $L_3$ and 180 is $L_4$). There are p flux bias lines, one for each level in the tree, to which p currents are applied ($I_1$, $I_2$, $I_3$, $I_4$ in FIG. 4). The mutual inductances of the lines to $L_1$, $L_2$, $L_3$ and $L_4$ are 155 (denoted $M_1$), 165 (denoted $M_2$), 175 (denoted $M_3$), and 185 (denoted $M_4$).

Another realization of the signal quantizer is the phase wheel. The phase wheel generalizes the notion of a Josephson junction. In FIG. 5A, we show the symbol for an M-spoke phase wheel 20, where M=8. The phase wheel 220 is shown with the different spokes 222, with the center node 224 of the wheel, and with the rim 226. The rim is grounded to the superconducting ground 230, and the input signal is injected at the center through the connection 228. A simplified representation of the phase wheel of FIG. 5A is shown in FIG. 5B.

Figure 5C:
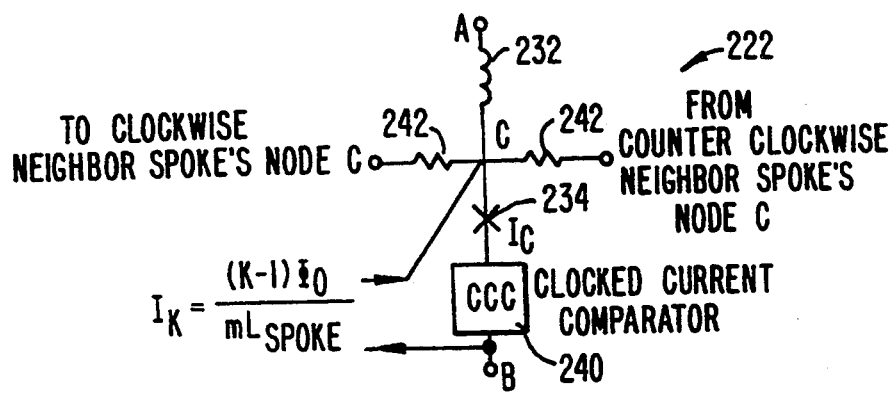
FIG. 5C denotes an equivalent circuit of the k-th spoke of the phase wheel in FIG. 5A, where k is a positive integer ranging from 1 to 8.

One may choose M to be a power of 2. The equivalent circuit for the $k^{th}$ spoke in FIG. 5A is shown in FIG. 5C, k ranging from 1 to M. Each spoke 222 includes an inductance $L_{spoke}$ 232, in series with a Josephson junction 234 with critical current $I_c$, in series with a clocked current comparator (CCC) 240. Successive spokes are preferably linked by damping resistors 242. The only difference between the spokes is the value of the flux bias. The $k^{th}$ spoke (k ranging from 1 to M) receives a flux bias of $(k-1)\Phi_0/M$ (corresponding to a control current of $(k-1)\Phi_0/ML_{spoke}$), In this way, the initial phases of the M junctions are set approximately at $2(k-1)\pi/M$, (k=1, ... M).

Since the Josephson current through junction k is $I_c\sin\phi_k$, where $\phi_k$ is its phase, and the M junctions are nearly uniformly spread out in phase over $2\pi$ radians, the Josephson currents through half (or about half if M is odd) of the M junctions will be positive and the Josephson currents through the other half (or about half) of the M junctions will be negative for any current injected into the wheel. One can think of the positive spokes as representing "daytime" and the negative spokes as representing "nighttime." The "noon" position is taken where the Josephson currents are maximum and the "midnight" position is taken where the Josephson currents are minimum. Mathematically, noon is where $\phi_k$ is nearest $\pi/2$ mod $2\pi$ and midnight is where $\phi_k$ is nearest $-\pi/2$ mod $2\pi$. More detailed illustrations of the "noon" and "nighttime" positions can be found in the application by Lee and Ko referenced above.

Figure 5D:
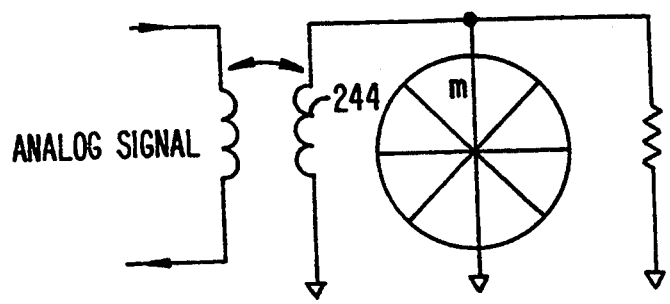
FIG. 5D illustrates a magnetic coupling coupling an input analog signal to the phase wheel of FIG. 5A.

When the wheel is connected in a loop with an inductor 244, as shown in FIG. 5D, we have a generalization of an rf SQUID with the wheel replacing the single Josephson junction. The rf SQUID is one Josephson junction connected in a loop with an inductor. As the applied flux to the SQUID loop increases (decreases) all of the M Josephson junction phases increase (decrease). Due to the alternating nature of $I_c\sin\phi_k$, the sets of positive and negative Josephson currents will change and the "noon" position will rotate. The action is periodic so that every time the applied flux changes by $\Phi_0$, one complete "day" will pass, i.e., noon will have rotated all the way around the wheel. If $L_{spoke}$ is kept small enough, the incremental action is also linear, i.e., a flux change of $\Phi_0/M$ will move the noon position by one spoke. By clocking all of the current comparators at once, we determine which spokes are positive and which are negative and therefore the position of noon. Noon can fall into any of M spokes or any of M positions midway between spokes. Each of the 2 different noon positions can be distinguished from any other by the set of comparators for a total of 2M separate states. This device therefore resolves the analog flux to $\Phi_0/M$ periodically in $\Phi_0$. There are many different realizations of the CCC. The preferred embodiment of CCC in FIGS. 4, 5C is the quantum flux parametron (QFP).

A very simple and reliable way of incorporating a (p+1)-bit phase wheel 202, where p is 3 or 4, in an N (8 to 11) bit A/D converter 206 is shown in FIG. 6. An (N−p)-bit superconducting bidirectional counter 204 provides N−p−1 most significant bits (MSB's). The phase wheel is connected in parallel with the superconducting counter 204 through the node 208. If phase wheel circuit 202 in FIG. 6 is replaced by the phase tree circuit 100 of FIG. 4, where the analog signal at node 208 in FIG. 6 is coupled to inductance 120 of circuit 100, circuit 100 will also function as an interpolator.

Lastly, in all of the superconducting counters proposed so far, the up-count errors are uncorrelated with the down-count errors. This implies that over time the dc output of the A/D will drift from the true dc value in a random walk fashion. In the proposed bidirectional counter the up-count and down-count errors resulting from excessive slew rates are anti-correlated. That is, if the bidirectional counter registers a slightly false reading at some time due to an excessively high positively slewing signal, it will correct itself at a later time if presented an excessively negative slewing signal.

The description of the preferred embodiment of this invention is given for purposes of explaining the principles thereof, and is not to be considered as limiting or restricting the invention since many modifications may be made by the exercise of skill in the art without departing from the scope of the invention.

What is claimed is:

1. A superconducting apparatus responsive to an input analog signal, comprising:
   a superconducting quantum interference compound flip-flop, said compound flip-flop having at least a first and a second internal flip-flops; and
   a biasing device coupled to said compound flip-flop applying a biasing flux for biasing said two internal flip-flops so that they have different phases;
   and wherein said internal flip-flops having different phases are connected to form a superconductive outer quantum interference loop;
   and wherein said internal flip-flops having different phases act to counterbalance each other to reduce any biasing power consumed and to render said compound flip-flop bidirectional.

2. The counting apparatus of claim 1, wherein said compound flip-flop includes two inductors, and wherein said first internal flip-flop and said second internal flip-flop are connected through said inductors to a common node forming said superconducting outer loop.

3. The apparatus of claim 2, further comprising a readout device magnetically connected to one or both of said internal flip-flops.

4. The counting apparatus of claim 3, wherein each of said internal flip-flops includes four substantially identical Josephson junctions J1, J2, J3, J4 connected to form a ring, a bridge inductor and damping resistors, said Josephson junctions J1 and J3 being connected to a first node, said Josephson junctions J2 and J4 being connected to a second node, said Josephson junctions J1 and J2 being connected to a third node, said Josephson junctions J3 and J4 being connected to a fourth node, said bridge inductor being connected between said first and said second nodes, said fourth node being connected to a reference voltage;

and wherein when the input signal is applied to said third node said readout device detects a readout signal from said bridge inductor.

5. The counting apparatus of claim 4, said ring containing two internal superconducting loops, one said internal loop being a lower loop defined by said Josephson junctions J3, J4 and said bridge inductor, the other internal loop being an upper loop defined by the Josephson junctions J1, J2, and said bridge inductor, each of said Josephson junctions being connected in parallel with said damping resistor.

6. The counting apparatus of claim 5, wherein said biasing device includes control lines magnetically coupled to said apparatus to apply half of a flux quantum $\Phi_0/2 = 1.034 * 10^{-15}$ Webers to said outer superconducting loop as well as to said two internal superconducting loops of each said internal flip-flop.

7. The counting apparatus of claim 6, wherein the readout device is a magnetometer device coupled to one or both of said bridge inductors of said internal flip-flops, wherein if both said bridge inductors are coupled the signals of said bridge inductors are added in quadrature in said magnetometer.

8. A superconducting circuit for bidirectional counting or for the analog-to-digital conversion of an input analog signal to a digital signal, said circuit having a plurality of bidirectional compound flip-flops (12(1)), (12(2)), ... (12(n)) connected to each other in a sequence;

and wherein each of said compound flip-flops includes at least a first and a second internal flip-flop;

and wherein said two internal flip-flops are connected to form a superconductive outer quantum interference loop such that when the internal flip-flops of each compound flip-flop are biased to different phases, such flip-flops will act to counterbalance each other to reduce any biasing power consumed and to render said compound flip-flop bidirectional.

9. The superconducting apparatus of claim 1, wherein the first internal flip-flop and the second internal flip-flop are identical.

10. The superconducting circuit of claim 8, wherein when said input analog signal is applied to the first of said compound flip-flops in the sequence, said first compound flip-flop counts the least significant bit of the input signal, and each compound flip-flop downstream from the first compound flip-flop in the sequence counts the next more significant bit than the preceding compound flip-flop.

11. The superconducting circuit of claim 10, wherein each said compound flip-flop includes a first internal flip-flop and a second internal driver-flip-flop and two inductors; and wherein said first internal flip-flop and said second internal flip-flop are connected through said inductors to a common input node forming said superconducting outer loop.

12. The superconducting circuit of claim 11, wherein each said internal flip-flop includes four substantially identical Josephson junctions J1, J2, J3, J4 connected to form a ring, a bridge inductor and damping resistors, said Josephson junctions J1 and J3 being connected to a first node, said Josephson junctions J2 and J4 being connected to a second node, said Josephson junctions J1 and J2 being connected to a third node, said Josephson junctions J3 and J4 being connected to a fourth node, said bridge inductor being connected between said first and said second nodes, said fourth node being connected to a reference voltage;

wherein the input node of each compound flip-flop downstream from the first is connected to the second node of the second driver-flip-flop of the preceding compound flip-flop in the sequence; and wherein when the input signal is applied to said input node of the first compound flip-flop, said readout device detects a readout signal from said bridge inductor of each said internal flip-flop of said compound flip-flop.

13. The circuit of claim 12, wherein in each of said internal flip-flops of each said compound flip-flop, said four Josephson junctions are connected in a ring, said ring containing two internal superconducting loops, one said internal loop being a lower loop defined by said Josephson junctions J3, J4 and said bridge inductor, the other internal loop being a upper loop defined by the Josephson junctions J1, J2, and said bridge inductor, each of said Josephson junctions being connected in parallel with said damping resistors.

14. The superconducting circuit of claim 13, further including a flux biasing device magnetically coupled to said apparatus to apply half of a flux quantum $\Phi_0/2 = 1.034 * 10^{-15}$ Webers to said outer superconducting loop of each compound flip-flop as well as to said two internal superconducting loops of each internal flip-flop of each compound flip-flop;

wherein said flux biasing renders each of said internal flip-flops to be bistable, having two states "0" and "1";

wherein the "0" state is defined by counterclockwise circulation current (CCW) in the lower internal loop and clockwise circulation current (CW) in the upper internal loop; and wherein the "1" state is defined by counterclockwise circulation current (CCW) in the upper internal loop and clockwise circulation current (CW) in the lower internal loop.

15. The superconducting circuit of claim 13, wherein each said driver-flip-flop sends forth drive current, while each said other internal flip-flop acts to counterbalance the driver-flip-flop to minimize the drive current of said compound flip-flop;

wherein a positive current increment of the input analog signal causes the reversal of said driver-flip-flop of first said compound flip-flop from the initial state "1" to the final state "0" causing propagation of a "CARRY" output signal from said driver-flip-flop and adding current to the subsequent compound flip-flop stage; and wherein a negative current increment of the input analog signal causes the reversal of said driver-flip-flop of first said compound flip-flop from the initial state "0" to the final state "1" causing propagation of a "BORROW" output signal from said driver-flip-flop and subtracting current from the subsequent compound flip-flop stage.

16. The apparatus of claim 15, further comprising a readout device coupled to one or both of said bridge inductors of each said internal flip-flop of said compound flip-flop, wherein if both said bridge inductors are coupled the signals of said bridge inductors are added in quadrature in said readout device.

17. A high resolution N-bit A/D converter, N being a positive integer, comprising a combination of a (p+1)

least significant bits phase wheel or phase tree interpolator, p being a positive integer, and a superconducting bidirectional flux quantum circuit connected in parallel with said phase wheel or phase tree interpolator for providing the (N−p−1) most significant bits for the analog-to-digital conversion of an input analog signal to a digital signal;

wherein said superconducting circuit includes a plurality of bidirectional compound flip-flops connected to each other in a sequence, said input analog signal being applied to the first of said compound flip-flops in the sequence;

wherein said bidirectional counter counts the analog signal to the nearest flux quantum; and wherein said phase wheel or phase tree interpolates the analog signal to $\frac{1}{2}p+1$ of a flux quantum modulo the flux quantum.

18. The superconductive circuit of claim 8, wherein each of said compound flip-flops includes two inductors, and wherein said first internal flip-flop and said second internal flip-flop of each of said compound flip-flops are connected through said inductors to a common node forming said superconducting loop.

19. The superconducting circuit of claim 8, wherein each of said compound flip-flops includes two identical internal flip-flops.

20. The superconducting circuit of claim 8, further comprising means for biasing the two flip-flops of each compound flip-flop to different phases.

* * * * *